US010816831B2

(12) United States Patent
Shinozaki et al.

(10) Patent No.: US 10,816,831 B2
(45) Date of Patent: Oct. 27, 2020

(54) OPTICAL MODULATOR AND OPTICAL TRANSMISSION APPARATUS

(71) Applicant: Sumitomo Osaka Cement Co., Ltd., Tokyo (JP)

(72) Inventors: Minoru Shinozaki, Tokyo (JP); Toru Sugamata, Tokyo (JP)

(73) Assignee: Sumitomo Osaka Cement Co., Ltd., Tokyo (JP)

( * ) Notice: Subject to any disclaimer, the term of this patent is extended or adjusted under 35 U.S.C. 154(b) by 0 days.

(21) Appl. No.: 16/294,377

(22) Filed: Mar. 6, 2019

(65) Prior Publication Data

US 2019/0285915 A1 Sep. 19, 2019

(30) Foreign Application Priority Data

Mar. 15, 2018 (JP) .................. 2018-047964

(51) Int. Cl.
*G02F 1/025* (2006.01)
*G02F 1/03* (2006.01)
*G02B 6/12* (2006.01)
*G02F 1/21* (2006.01)

(52) U.S. Cl.
CPC ............ *G02F 1/025* (2013.01); *G02F 1/0316* (2013.01); *G02B 2006/12142* (2013.01); *G02F 2001/212* (2013.01)

(58) Field of Classification Search
CPC .................. G02F 1/0316; G02F 2001/212
See application file for complete search history.

(56) References Cited

U.S. PATENT DOCUMENTS

| 7,064,425 B2 * | 6/2006 | Takahashi | ............... H01L 24/85 |
| | | | 257/686 |
| 2013/0243364 A1 * | 9/2013 | Kanno | ............... G02F 1/035 |
| | | | 385/2 |

FOREIGN PATENT DOCUMENTS

| JP | 2006332152 A | * 12/2006 | ............. H01L 24/85 |
| JP | 2017173353 A | 9/2017 | |

* cited by examiner

*Primary Examiner* — Omar R Rojas
(74) *Attorney, Agent, or Firm* — IpHorgan Ltd.

(57) ABSTRACT

An optical modulator using an optical modulation element in which an optical waveguide and a plurality of electrodes for controlling light waves propagating through the optical waveguide are formed on a substrate, in which at least one stress relieving structure is provided on an upper surface of the electrode opposite to a surface of the substrate in order to relieve stress generated due to pressure applied at the time of wire-bonding of a metal wire.

8 Claims, 5 Drawing Sheets

PERSPECTIVE VIEW SHOWING DETAILS OF A PORTION

PERSPECTIVE VIEW SHOWING DETAILS OF A PORTION

OPTICAL MODULATOR AND OPTICAL TRANSMISSION APPARATUS

BACKGROUND OF THE INVENTION

Field of the Invention

The present invention relates to an optical modulator and an optical transmission apparatus using an optical modulator.

Description of Related Art

Currently, in a DP-QPSK (Dual Polarization-Quadrature Phase Shift Keying) modulator that is a mainstream as an optical modulator for long-distance and medium-distance optical communication systems, an optical modulation element using a LiNbO3 substrate (hereinafter, referred to as an LN substrate) is mainly used (for example, refer to Japanese Laid-open Patent Publication No. 2017-173353). Such an optical modulation element has an optical waveguide formed on the LN substrate and a plurality of electrodes for controlling light waves propagating through the optical waveguide. Then, on the optical modulation element, wire bonding is used for connection between the electrodes or between the electrodes and conductor patterns on a relay substrate for relaying connection with terminals provided in the optical modulator housing.

For wire bonding, there is a method, such as ball bonding or wedge bonding. In any method, at the time of bonding connection, compression pressure is applied while performing heating at the contact point between the metal wire and the electrode, so that the metal wire is bonded to the electrode. For this reason, in a bonding portion of the electrode, deformation occurs due to the stress generated by the compression pressure. In particular, in the optical modulation element using the LN substrate, in general, gold (Au) that is stable since a change in composition is hard to occur but is soft in terms of hardness is used in many cases. Accordingly, compared with electrodes formed of other materials, electrode deformation may easily occur at the time of bonding. As a countermeasure, it is conceivable to relieve the bonding conditions to reduce the compression pressure and the like so as to suppress the electrode deformation. In this case, however, other problems such as bonding peeling may occur.

In addition, in recent years, the DP-QPSK modulator described above has also expanded its adaptation area to short-distance metro communication system applications. In the metro communication system, restrictions on the installation space of the communication system are severe, and a demand for miniaturization of the optical transmission apparatus or miniaturization of the optical modulator to be mounted in the optical transmission apparatus is particularly strong. For this reason, in order to miniaturize the optical modulation element, narrowing and thickening of electrodes formed on the optical modulation element and narrow interval for making the interval between electrodes narrow are progressing.

In addition to this, due to the increasing demand for communication capacity every year, also in the optical modulation element of the optical modulator used in the medium to long distance optical communication system, electrodes on the optical modulation element are becoming narrower and thicker and the interval between the electrodes is decreasing with the aim of further increasing the bandwidth.

Therefore, due to the reduction in the width of the electrode cross section and the increase in the thickness, the aspect ratio of the electrode cross section increases greatly exceeding 1. As a result, the above-described situation where electrode deformation is caused by the pressure (bonding pressure) applied at the time of bonding is more likely to occur.

FIG. 11 is a diagram showing an example of electrode deformation caused by bonding pressure. FIG. 11 shows cross sections of ground electrodes 1120 and 1122, which are provided on an LN substrate 1110 on which optical waveguides 1100 and 1102 are formed, and a so-called hot electrode 1130 to which a radio frequency signal potential is applied. Each of the ground electrodes 1120 and 1122 and the hot electrode 1130 has a rectangular cross section (vertically long in the diagram) having an aspect ratio of, for example, about 3 to 5 in order to narrow and thicken the electrodes as described above. Therefore, in order to keep the ground electrodes 1120 and 1122 at the same potential in a radio frequency manner, in a case where bonding of a metal wire 1140 is performed on the ground electrodes 1120 and 1122, the ground electrodes 1120 and 1122 can be deformed by the bonding pressure applied during the bonding process. In the shown example, an upper portion of the ground electrode 1120 is inclined toward the hot electrode 1130, and the ground electrode 1122 is crushed in a direction in which a height of the ground electrode 1122 decreases, so that a part of the ground electrode 1122 is inflated in the width direction.

Such deformation locally changes the interval between the ground electrodes 1120 and 1122 and the hot electrode 1130 and locally changes the characteristic impedance of the radio frequency transmission line formed by the ground electrodes 1120 and 1122 and the hot electrode 1130, which has an adverse effect on the light modulation characteristic as an optical modulator. In addition, the change in the characteristic impedance also causes impedance mismatch between the radio frequency transmission line and an external circuit, which has a further adverse effect on the light modulation characteristic. In addition, in some cases, manufacturing defects, for example, a short circuit between electrodes due to direct contact between the ground electrode 1120 and the hot electrode 1130, a short circuit due to unintentional contact between the metal wire 1140 and the hot electrode 1130 as indicated by reference numeral 1150 in FIG. 11, and the like occur.

The probability of occurrence of the characteristic change or the manufacturing defects described above can increase as the allowable amount of the electrode deformation decreases with the narrower interval between electrodes described above.

In addition, bonding at the time of manufacturing is generally performed by automatically detecting a large number of bonding positions based on some preset position recognition patterns by an automatic bonding apparatus. However, a slight shift of the actual bonding position may occur due to the problem of shift of the individual position recognition pattern or the machine precision. Then, such a shift of the bonding position can further increase the probability of occurrence of electrode deformation.

SUMMARY OF THE INVENTION

From the above background, there is a demand for a technique for appropriately performing wire bonding to narrowed and/or thickened optical modulation element electrodes while avoiding deformation of the electrodes.

An aspect of the invention is an optical modulator using an optical modulation element in which an optical waveguide and a plurality of electrodes for controlling light waves propagating through the optical waveguide are formed on a substrate.

The optical modulator includes at least one stress relieving structure that is provided on an upper surface of the electrode opposite to a surface of the substrate in order to relieve stress generated due to pressure applied at the time of wire-bonding a metal wire.

According to another aspect of the invention, the stress relieving structure is at least one convex portion or a concave portion formed on the upper surface of the electrode.

According to still another aspect of the invention, the stress relieving structure is at least one groove formed on the upper surface of the electrode or an island-shaped structure around which a groove is formed.

According to still another aspect of the invention, the stress relieving structure is at least one metal bump formed on the upper surface of the electrode.

According to still another aspect of the invention, the metal bump has a curved portion.

According to still another aspect of the invention, the metal bump is substantially circular in a plan view.

According to still another aspect of the invention, the metal wire is connected onto the metal bump by ball bonding.

According to still another aspect of the invention, a length of the metal bump measured along a width direction of the electrode is ⅓ or less of the width of the electrode.

According to still another aspect of the invention, the stress relieving structure comprises a material different from a material forming the electrode, a material that is the same material as the material forming the electrode and has a hardness different from the material forming the electrode, or the same material as the metal wire.

Another aspect of the invention is an optical transmission apparatus in which any one of the optical modulators described above is mounted.

Another aspect of the invention is a method of manufacturing the optical modulator including: forming the metal bump on the upper surface of the electrode using ball bonding.

DETAILED DESCRIPTION OF THE INVENTION

Hereinafter, embodiments of the invention will be described with reference to the diagrams.

First Embodiment

Figure 1:
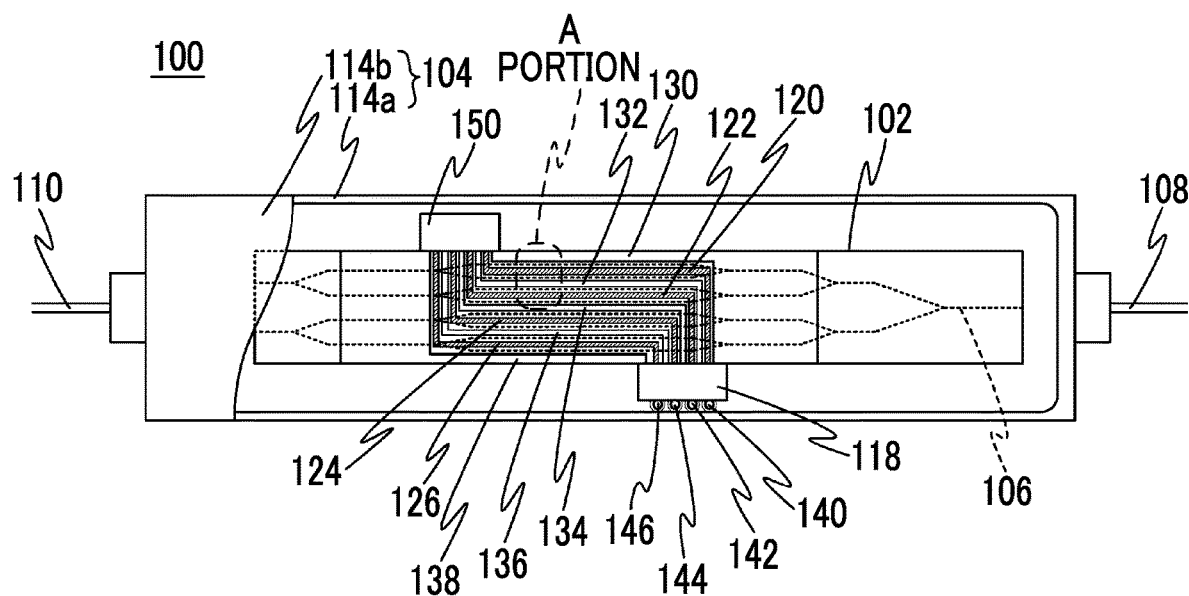
FIG. 1 is a diagram showing the configuration of an optical modulator according to a first embodiment of the invention.

FIG. 1 is a plan view showing the configuration of an optical modulator according to a first embodiment of the invention. An optical modulator 100 includes an optical modulation element 102, a housing 104 in which the optical modulation element 102 is housed, an optical fiber 108 for inputting light to the optical modulation element 102, and an optical fiber 110 for guiding light output from the optical modulation element 102 to the outside of the housing 104.

The optical modulation element 102 is, for example, a DP-QPSK optical modulator including an optical circuit 106, which includes four Mach-Zehnder type optical waveguides provided on an LN substrate, and a plurality of electrodes, which are provided on the optical circuit 106 to perform modulation by controlling light waves propagating through the optical waveguide. Two light beams output from the optical modulation element 102 are polarization-combined into one light beam by, for example, a lens optical system (not shown), and guided to the outside of the housing 104 through the optical fiber 110. In addition, the configuration of the optical modulation element 102 will be further described later.

The housing 104 includes a case 114a and a cover 114b to which the optical modulation element 102 is fixed. In FIG. 1, in order to facilitate understanding of the configuration of the inside of the housing 104, only a part of the cover 114b is shown on the left side of the diagram. In practice, however, the cover 114b is disposed so as to cover the entire box-shaped case 114a, so that the inside of the housing 104 is hermetically sealed.

In the case 114a, four lead pins 140, 142, 144, and 146 that are conductors for inputting a radio frequency signal are provided on the left side of the diagram. These lead pins are respectively connected to one ends of four hot electrodes 120, 122, 124, 126 provided in the four Mach-Zehnder type optical waveguides forming the optical circuit 106 of the optical modulation element 102 through a relay substrate 118. The hot electrodes 120, 122, 124, and 126 are traveling wave type electrodes forming four traveling wave type radio frequency transmission lines together with ground electrodes 130, 132, 134, 136, and 138 formed so as to interpose the hot electrodes in the surface direction of the optical modulation element 102. Other ends of the hot electrodes 120, 122, 124, and 126 forming the four traveling wave type electrodes are terminated by a terminator 150 that is an impedance element having an impedance (for example, 50 Ω) equal to the characteristic impedance of the traveling wave type electrodes.

Figure 2:
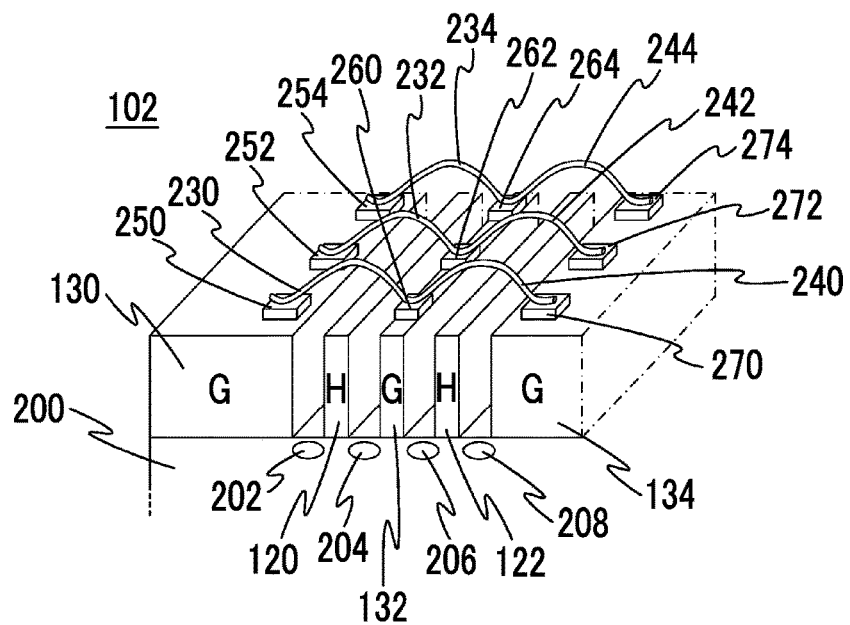
FIG. 2 is a perspective view showing details of an A portion of the optical modulator shown in FIG. 1.

FIG. 2 is a perspective view showing details of an A portion in a case where a cross section on the left side of the diagram of the A portion of the optical modulator 100 shown in FIG. 1 is viewed from the obliquely upward direction (direction perpendicular to the paper surface of FIG. 1). On an LN substrate 200 forming the optical modulation element 102, optical waveguides 202, 204, 206, and 208 corresponding to the four parallel waveguides on the upper side in FIG. 1, among eight parallel waveguides included in the four Mach-Zehnder type optical waveguides forming the optical circuit 106, are formed. On the surface of the LN substrate 200, the hot electrodes 120 and 122 are formed along portions in which the optical waveguides 202, 204, 206, and 208 are formed. In addition, on the surface of the LN substrate 200, the ground electrodes 130, 132, and 134 are formed so as to interpose the hot electrodes 120 and 122 in the surface direction of the LN substrate 200. Here, the hot electrode 120 and the like and the ground electrode 130 and the like are formed using, for example, gold (Au).

In addition, the ground electrodes 130 and 132 are connected to each other by a plurality of metal wires 230, 232, and 234 at regular intervals or at irregular intervals so that the potential between the ground electrodes becomes the same potential even in a radio frequency manner in each portion in the length direction of the ground electrode. Similarly, the ground electrodes 132 and 134 are connected to each other by a plurality of metal wires 240, 242, and 244 at regular intervals or at irregular intervals so that the potential between the ground electrodes becomes the same potential even in a radio frequency manner in each portion in the length direction of the ground electrode. Here, the metal wires 230, 232, 234, 240, 242, and 244 are connected and fixed to the corresponding electrodes by wire bonding.

In particular, in the optical modulator 100 according to the present embodiment, as a stress relieving structure for relieving the occurrence of stress at the ground electrode 130 due to pressure application at the time of wire bonding of the metal wire 230 and the like, convex portions 250, 252, and 254 having rectangular shapes in a plan view are provided in portions, to which the metal wires 230, 232 and 234 are wire-bonded, of the upper surface (surface opposite to the LN substrate 200) of the ground electrode 130. Similarly, as a stress relieving structure in the ground electrode 132, in portions, to which the metal wires 230 and 240, 232 and 242, and 234 and 244 are wire-bonded, of the upper surface of the ground electrode 132, convex portions 260, 262, and 264 having rectangular shapes in a plan view are provided as stress relieving structures for relieving the occurrence of stress due to pressure application at the time of wire bonding. In addition, similarly, as a stress relieving structure in the ground electrode 134, in portions, to which the metal wires 240, 242, and 244 are wire-bonded, of the upper surface of the ground electrode 134, convex portions 270, 272, and 274 having rectangular shapes in a plan view are provided as stress relieving structures for relieving the occurrence of stress due to pressure application at the time of wire bonding.

Figure 11:
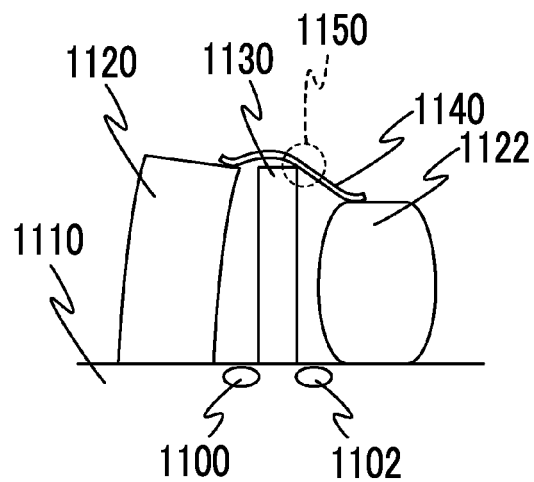
FIG. 11 is a diagram showing an example of electrode deformation in an optical modulator in the related art.

By adopting such a configuration, the pressure (bonding pressure) applied to the corresponding electrode at the time of bonding the metal wire 230 and the like is absorbed by selective deformation of the convex portion 250 and the like among the convex portion 250, the ground electrode 130, and the like, the occurrence of stress to the ground electrode 130 and the like (hereinafter, also referred to as an electrode body portion) is relieved. Therefore, in the optical modulator 100, since the occurrence of deformation of the electrode body portion due to the bonding pressure in the related art, such as that shown in FIG. 11, is suppressed, the occurrence of a change in radio frequency characteristics due to the deformation or manufacturing defects, such as short-circuit failure, is suppressed.

The effect of suppressing the deformation of the electrode body portion as described above is effective in a case where the aspect ratio of the hot electrode and/or the ground electrode is 2 or more. In particular, in a case where the aspect ratio of the hot electrode and/or the ground electrode is 3 or more, a large effect can be obtained.

In addition, the above-described selective deformation in the convex portion 250 and the like also has an effect of increasing the adhesion by filling the gap between the ground electrode 130 and the like and the metal wire 230 and the like, so that the adhesive force of the metal wire 230 and the like with respect to the convex portion 250 and the like is increased.

In addition, the convex portion 250 and the like can be easily formed by the normal wafer process. In addition, in the present embodiment, the convex portion 250 and the like are formed by plating of gold (Au), for example. However, it is preferable that the convex portion 250 and the like are formed of a material (for example, silver (Ag) plated so that the hardness is lower than that of the electrode body portion) different from the electrode body portion or an Au layer with a lower hardness even in a case where the same material, such as Au, is used, so that deformation of the electrode body portion is further suppressed while increasing the adhesion of the metal wire 230 and the like. Such an Au layer with a low hardness can be realized, for example, by adjusting the composition of the plating solution at the time of forming the Au layer by plating. In addition, from the viewpoint of the adhesive force of the metal wire 230 and the like and the stress relief of the electrode body portion, the most preferable material for the convex portion 250 and the like is the same material as the metal wire 230 and the like used for bonding.

In the embodiment described above, the stress relieving structure is the convex portion 250 and the like provided on the upper surface of the ground electrode 130 and the like, but is not limited to this. Hereinafter, some modification examples of the stress relieving structure that can be used instead of the convex portion 250 will be described.

First Modification Example

Figure 3:
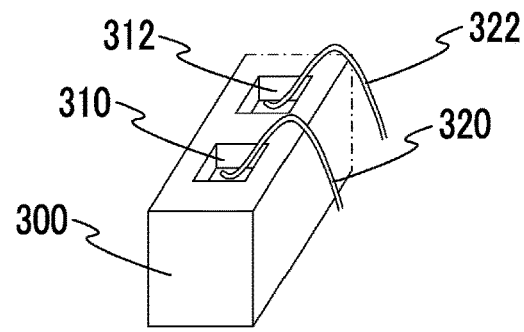
FIG. 3 is a diagram showing the configuration of a first modification example of a stress relieving structure.

FIG. 3 is a diagram showing a first modification example of the stress relieving structure that can be used instead of the convex portion 250 and the like shown in FIG. 2. In FIG. 3, an electrode 300 is, for example, the ground electrode 130 in FIG. 2, and has concave portions 310 and 312 provided on the upper surface of the electrode 300 as stress relieving structures. Then, metal wires 320 and 322 that connect the electrode 300 and other electrodes to each other are bonded to the bottom surfaces of the concave portions 310 and 312.

In this modification example, since portions to which the metal wire 320 and the like are bonded are the bottom surfaces of the concave portion 310 and the like that are lowered from the upper surface of the electrode 300 toward the substrate, the state of the portions is effectively the same as the electrode with a low height from the viewpoint of the stress applied to the electrode body portion. Therefore, the occurrence of deformation, such as collapse or crushing of the electrode body portion, is suppressed. In addition, from the viewpoint of avoiding deformation of the electrode body portion, it is preferable that the depths of the concave portion 310 and the like are as large as possible within a range where the workability of bonding, a reduction in conductor loss of the electrode 300 and the like due to providing the concave portion 310 and the like, and the like are allowed.

Second Modification Example

Figure 4:
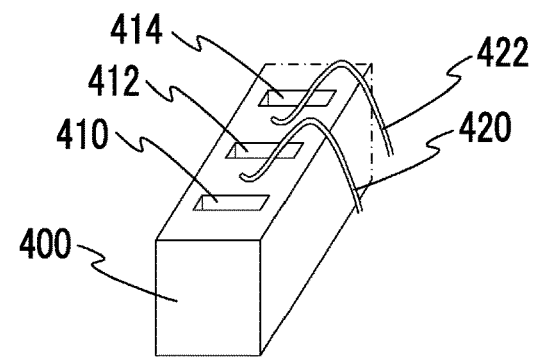
FIG. 4 is a diagram showing the configuration of a second modification example of the stress relieving structure.

FIG. 4 is a diagram showing a second modification example of the stress relieving structure that can be used instead of the convex portion 250 and the like shown in FIG. 2. In FIG. 4, an electrode 400 is, for example, the ground electrode 130 in FIG. 2, and has grooves 410, 412, and 414 provided on the upper surface of the electrode 400 as stress relieving structures. Then, metal wires 420 and 422 that connect the electrode 400 and other electrodes to each other are bonded to portions of the upper surface of the electrode 400 interposed by the grooves 410, 412, and 414.

In this modification example, since the deformation of the electrode 400 due to the bonding stress selectively occurs so that the opening cross sections of the groove 410 and the like formed in the vicinity of the portions where the metal wire 420 and the like are bonded are deformed, the occurrence of deformation in the outer shape of the electrode body portion is suppressed.

In addition, the groove 410 and the like do not necessarily need to be deeply formed up to the bonding surface between the electrode 400 and the substrate, and may be formed only up to a depth between the electrode 400 and the substrate. In addition, the bonding positions of the metal wire 420 and the like may be in the vicinity of the groove 410 and the like on the upper surface of the electrode 400 so that the bonding pressure is relieved by the deformation of the groove 410 and the like, or do not necessarily need to be interposed by the grooves 410, 412, and 414. That is, the bonding positions can be various positions, such as between the groove 410 and the like and the end portion of the upper surface of the electrode 400, as long as the bonding positions are positions where the stress is effectively absorbed by the groove 410 and the like.

Third Modification Example

Figure 5:
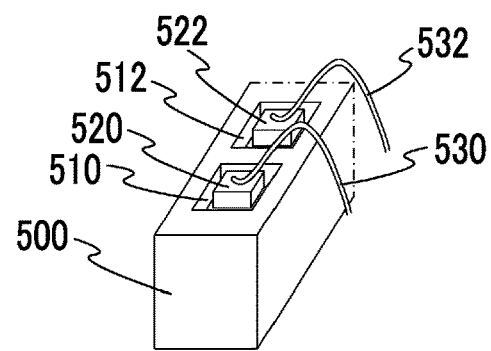
FIG. 5 is a diagram showing the configuration of a third modification example of the stress relieving structure.

FIG. 5 is a diagram showing a third modification example of the stress relieving structure that can be used instead of the convex portion 250 and the like shown in FIG. 2. In FIG. 5, an electrode 500 is, for example, the ground electrode 130 in FIG. 2, and has island-shaped structure portions 520 and 522, around which grooves 510 and 512 are formed, on the upper surface of the electrode 500 as stress relieving structures. Then, metal wires 530 and 532 that connect the electrode 500 and other electrodes to each other are bonded to the island-shaped structure portions 520 and 522.

In this modification example, the island-shaped structure portion 520 and the like can be selectively deformed by the bonding pressure similarly to the convex portion 250 and the like shown in FIG. 2, and the occurrence of deformation in the outer shape of the electrode body portion can be further suppressed by selectively deforming the groove 510 and the like as in the second modification example shown in FIG. 4.

Fourth Modification Example

Figure 6:
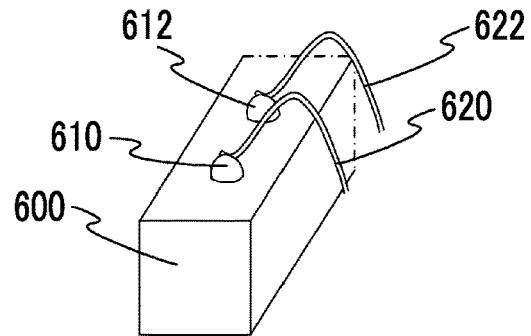
FIG. 6 is a diagram showing the configuration of a fourth modification example of the stress relieving structure.

FIG. 6 is a diagram showing a fourth modification example of the stress relieving structure that can be used instead of the convex portion 250 and the like shown in FIG. 2. In FIG. 6, an electrode 600 is, for example, the ground electrode 130 in FIG. 2. On the upper surface of the electrode 600, metal bumps 610 and 612 that are raised portions formed using metal are provided as stress relieving structures. Then, metal wires 620 and 622 that connect the electrode 600 and other electrodes to each other are bonded to the metal bumps 610 and 612. Therefore, since the stress caused by the bonding pressure at the time of bonding is absorbed by deformation of the metal bump 610 and the like, deformation of the electrode body portion at the electrode 600 is suppressed.

For the metal bump 610 and the like, for example, by using the ball forming function of a wire bonder (wire bonding apparatus) that performs ball bonding, balls (balls formed of metal wires used for bonding) can be formed on the upper surface of the electrode 600 as metal bumps.

The forming position accuracy of the metal bump 610 and the like is lower than that of the convex portion 250 and the like shown in FIG. 2 since it is difficult to form the metal bump 610 and the like in the wafer process. However, the metal bump 610 and the like are advantageous in that the metal bump 610 and the like can be easily formed in a narrow region, the forming position can be freely set or changed, the forming position can be changed or adjusted while watching the radio frequency characteristics (for example, radio frequency characteristics as a radio frequency transmission line formed by the electrode 600 and a ground electrode (not shown) around the electrode 600) of the entire electrode 600 including a bonding portion, and/or the process can be simplified and sufficient adhesion between the metal wire and the metal bump 610 and the like can be secured since the metal bump 610 and the like can be formed of the same material as the metal wire used for bonding.

Figure 7:
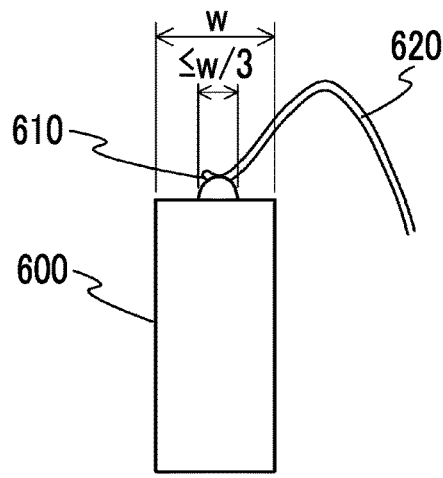
FIG. 7 is a diagram showing a desirable size of a metal bump in the fourth modification example.

In addition, the metal bump 610 and the like can be formed at any positions on the upper surface of the electrode 600. However, in the case of forming the metal bump 610 and the like by a wire bonder or the like, the accuracy of the forming position of the metal bump 610 and the like is lower than that of the convex portion 250 and the like shown in FIG. 2 that can be formed by the wafer process. Therefore, as shown in FIG. 7, it is preferable that the lengths of the metal bump 610 and the like along the width direction of the corresponding electrode are set to w/3 or less with respect to the width w of the electrode 600 so that the edges of the metal bump 610 and the like are not too close to the edge of the electrode 600.

In the example shown in FIG. 6, the metal wires 620 and 622 are respectively connected to the metal bumps 610 and 612 by wedge bonding. However, the bonding of the metal wire to the metal bump 610 and the like is not limited to the wedge bonding.

Figure 8:
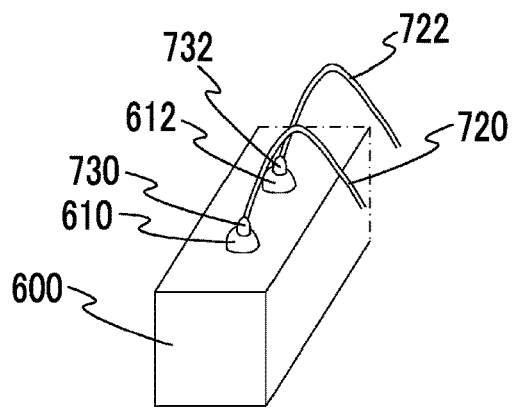
FIG. 8 is a diagram showing an example using ball bonding in the fourth modification example.

In FIG. 8, metal wires 720 and 722 are connected to the metal bumps 610 and 612 on the electrode 600 shown in FIG. 6 by ball bonding. FIG. 8 shows metal balls 730 and 732 formed on the metal bumps 610 and 612 by tip ends of the metal wires 720 and 722 that thermally melt at the time of bonding to the metal bumps 610 and 612.

In the ball bonding, a metal ball is formed at the tip end of the metal wire by heating and melting the tip end of the metal wire, and the metal ball is connected to a metal (in the example shown in FIG. 8, the metal bump 610 and the like), such as an electrode, by thermal compression. For this reason, the bonding pressure in the case of ball bonding is lower than that in the case of wedge bonding in which a metal wire is brought into close contact with a metal, such as an electrode, and bonded to the metal by ultrasonic heating. Therefore, in the example shown in FIG. 8, the deformation in the electrode body portion of the electrode 600 is further suppressed as compared with the configuration shown in FIG. 6.

Figure 9:
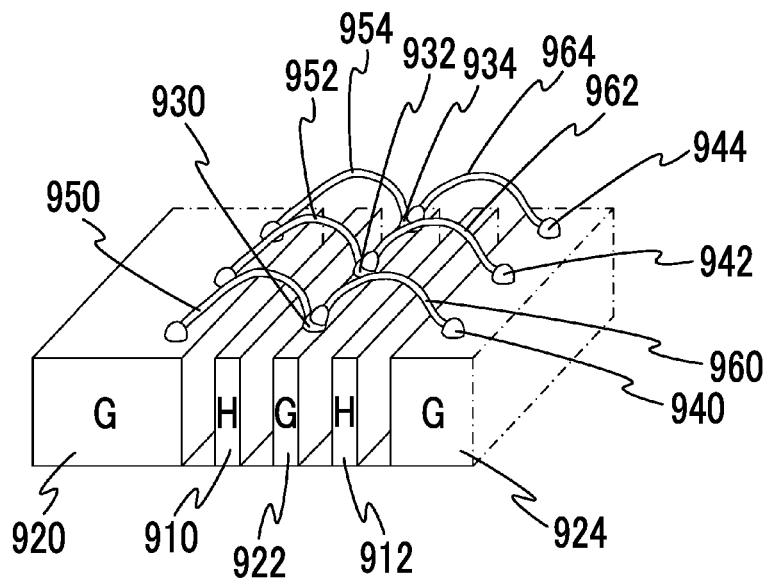
FIG. 9 is a diagram showing an example of connection between electrodes in a case where the configuration of the fourth modification example is used.

FIG. 9 is a diagram showing an example of connection between electrodes in a case where a metal bump is used as a stress relieving structure. In FIG. 9, hot electrodes 910 and 912 correspond to the hot electrodes 120 and 122 in FIG. 2, and ground electrodes 920, 922, and 924 correspond to the ground electrodes 130, 132, and 134 in FIG. 2.

Metal bumps 930, 932, and 934 as stress relieving structures are formed on the ground electrode 922, and metal bumps 940, 942, and 944 as stress relieving structures are formed on the ground electrode 924. Then, one ends of metal wires 950, 952, and 954 connecting the ground electrodes 920 and 922 to each other are connected to the ground electrode 920 by ball bonding, and other ends of the metal wires 950, 952, and 954 are respectively connected to the metal bumps 930, 932, and 934, which are stress relieving structures formed on the ground electrode 922, by wedge bonding.

In general, ball bonding for bonding metal wires can be used only in the case of bonding the tip end of a metal wire fed out from a wire reel to an electrode or the like (so-called first bonding) due to the structure of a wire bonder. Therefore, in the example shown in FIG. 9, the metal wires 950, 952, and 954 are connected to the ground electrode 920 by ball bonding and then connected to the metal bumps 930, 932, and 934 of the ground electrode 922 by wedge bonding.

Similarly, one ends of metal wires 960, 962, and 964 connecting the ground electrodes 922 and 924 to each other are respectively connected to the metal bumps 930, 932, and 934, which are stress relieving structures formed on the ground electrode 922, by ball bonding. In addition, other ends of the metal wires 960, 962, and 964 are respectively connected to the metal bumps 940, 942, and 944, which are stress relieving structures formed on the ground electrode 924, by wedge bonding.

In the example shown in FIG. 9, the metal bumps 930, 932, and 934 as stress relieving structures are formed on the ground electrode 922 subjected to wedge bonding with a larger bonding pressure than ball bonding, and the metal bumps 940, 942, and 944 as stress relieving structures are formed on the ground electrode 924 subjected to wedge bonding with a larger bonding pressure than ball bonding. Therefore, the occurrence of deformation of the electrode body portions of the ground electrodes 922 and 924 is suppressed.

In addition, in a case where the area of two metal balls formed at the time of ball bonding can be secured in the metal bumps 930, 932, and 934, the metal wires 950, 952, and 954 may also be ball-bonded to the metal bumps 930, 932, and 934 similarly to the metal wires 960, 962, and 964. In this case, since the portions of the metal wires 950, 952, and 954 connected to the ground electrode 920 are wedge-bonded, it is preferable to form a metal bump that is a stress relieving structure on the ground electrode 920.

In addition, the metal bump 610 and the like of the present application are stress relieving structures having a function of stress relief/dispersion at the time of bonding, and have an effect of increasing the adhesion to the bonded wire. In another embodiment, an example in which the stress relieving structure is formed in a rectangular shape by a wafer process is mentioned.

On the other hand, in a case where the metal bump 610 and the like are formed in a substantially hemispherical shape, deformation stress in wire bonding can be easily equivalently dispersed in all directions due to structures close to the substantial hemisphere. Therefore, a configuration very suitable as the stress relieving structure of the invention is obtained.

In addition, as a method of manufacturing the substantially hemispherical metal bump 610 and the like, the metal bump 610 and the like are formed by ball bonding. By performing the ball bonding for the metal bump, wires to be bonded to the metal bump 610 and the like are formed of the same material. Therefore, since the affinity between materials is high, adhesion after bonding is also improved.

In addition, the substantially hemispherical shape of the metal bump 610 and the like referred to herein does not mean only almost the hemisphere. The shape of the metal bump 610 may be a shape in which the deformation stress is isotropically dispersed at the time of bonding to the metal bump 610 and the like. For example, the shape of the metal bump 610 may be a shape in which the sphere is deformed, a shape that is substantially circular in a plan view, and the like including a certain curved portion.

Second Embodiment

Next, a second embodiment of the invention will be described. The present embodiment is an optical transmission apparatus in which an optical modulator including any one of the stress relieving structures according to the modification examples shown in FIGS. 3, 4, 5, 6, 7, 8, and 9, which is the optical modulator 100 according to the first embodiment or an optical modulator having the same configuration as the optical modulator 100, is mounted.

Figure 10:
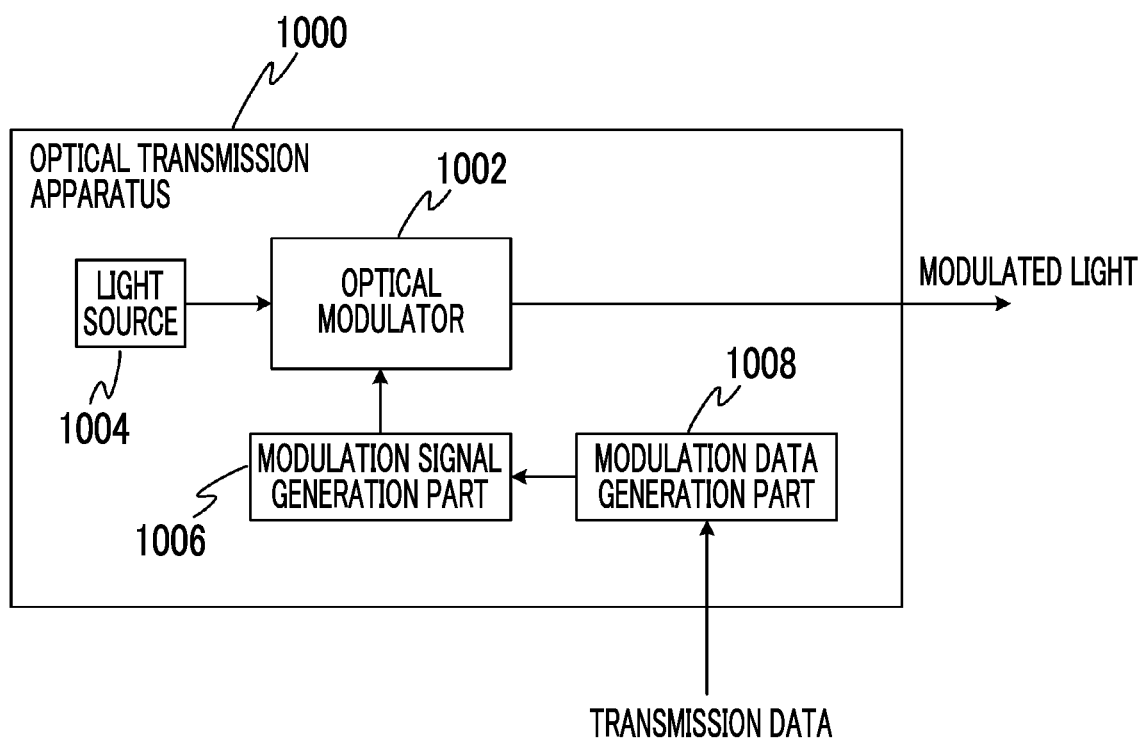
FIG. 10 is a diagram showing the configuration of an optical transmission apparatus according to a second embodiment of the invention.

FIG. 10 is a diagram showing the configuration of the optical transmission apparatus according to the present embodiment. An optical transmission apparatus 1000 includes an optical modulator 1002, a light source 1004 for inputting light to the optical modulator 1002, a modulation signal generation part 1006, and a modulation data generation part 1008.

The optical modulator 1002 can be an optical modulator including any one of the stress relieving structures according to the modification examples shown in FIGS. 3, 4, 5, 6, 7, 8, and 9, which is the optical modulator 100 having the same configuration shown in FIGS. 1 and 2 or an optical modulator having the same configuration as the optical modulator 100. However, in the following description, it is assumed that the optical modulator 100 is used as the optical modulator 1002 in order to avoid redundant description and facilitate understanding.

The modulation data generation part 1008 receives transmission data given from the outside, generates modulation data (for example, data obtained by converting or processing transmission data into a predetermined data format) for transmitting the transmission data, and outputs the generated modulation data to the modulation signal generation part 1006.

The modulation signal generation part 1006 is an electronic circuit (drive circuit) that outputs an electric signal for causing the optical modulator 1002 to perform a modulation operation, and generates a modulation signal, which is a radio frequency signal for causing the optical modulator 1002 to perform an optical modulation operation according to the modulation data, based on the modulation data output from the modulation data generation part 1008 and inputs the generated modulation signal to the optical modulator 1002. The modulation signal includes four radio frequency signals corresponding to the four hot electrodes 120, 122, 124, and 126 of the optical modulation element 102 included in the optical modulator 100 that is the optical modulator 1002.

Therefore, light output from the light source 1004 is modulated by the optical modulator 1002 to become modulated light, and the modulated light is output from the optical transmission apparatus 1000.

As described above, in the optical modulator 100 according to the first embodiment described above, the convex portion 250 and the like that are stress relieving structures for relieving the occurrence of stress due to bonding pressure applied at the time of wire bonding the metal wire 230 and the like are formed on the upper surfaces of the ground electrode 130 and the like. Therefore, in the optical modulator 100, even in a case where the aspect ratio of the cross-sectional shape of the electrode is larger than 1, wire bonding to the electrode can be appropriately performed while avoiding deformation of the electrode (for example, the ground electrode 132). As a result, in the optical modulator 100, for example, since deformation of each electrode forming the traveling wave type electrode is effectively prevented, a change in radio frequency characteristics of the electrode before and after the wire bonding process can be suppressed, and manufacturing defects such as short-circuit failure that can occur in the process can be prevented.

In addition, as examples of the stress relieving structure, the first to fourth modification examples are shown in addition to the convex portion 250. However, the configuration of the stress relieving structure is not limited to these. The stress relieving structure can be a combination or a modification of the configurations shown in these examples. For example, the stress relieving structure may be formed by combining the electrode with the convex portion 250 and the like and the groove 410 and the like. In addition, for example, as shown in FIG. 4, the groove 410 and the like can have opening cross sections of any shape besides having rectangular opening cross sections.

In addition, in the embodiments and the modification examples described above, all of the electrodes are connected to each other by metal wires. However, the invention is not limited to this. Instead of or in addition to this, electrodes may be connected to each other by ribbon bonding using a ribbon-shaped metal ribbon, for example.

In addition, in the embodiments and the modification examples described above, two or three stress relieving structures each including a convex portion, a concave portion, or the like are provided for one electrode. However, the number of stress relieving structures is not limited to this. Depending on the ease of deformation or the difficulty of deformation of an electrode with respect to the bonding pressure, at least one certain number of stress relieving structures may be provided in the electrode.

In addition, in the embodiments described above, as an example, the optical modulation element 102 is a DP-QPSK modulator having four hot electrodes on the LN substrate 200. However, the invention is not limited to this. The invention can be similarly applied to an optical modulator having a plurality of RF electrodes other than four and/or an optical modulator using a material other than LN as a substrate.

What is claimed is:

1. An optical modulator using an optical modulation element in which an optical waveguide and a plurality of electrodes for controlling light waves propagating through the optical waveguide are formed on a substrate,
    wherein the plurality of electrodes include:
    a first ground electrode, a second ground electrode, and a third ground electrode each formed along the optical waveguide;
    a first hot electrode that is interposed between the first ground electrode and the second ground electrode; and
    a second hot electrode that is interposed between the second ground electrode and the third ground electrode,
    a convex portion having a convex shape is provided on an upper surface of the first ground electrode, the second ground electrode, and the third ground electrode, wherein the upper surface is a surface that is opposite to a surface facing the substrate,
    the first ground electrode and the second ground electrode are connected by a metal wire striding over the first hot electrode, and wherein the metal wire is wire-bonded to each respective convex portion, the second ground electrode and the third ground electrode are connected by a metal wire striding over the second hot electrode, and wherein the metal wire is wire-bonded to each respective convex portion,
    the metal wire connecting the first ground electrode and the second ground electrode and the metal wire connecting the second ground electrode and the third ground electrode are wire-bonded at an approximately same position of the convex portion that is formed on the second ground electrode,
    wherein an aspect ratio of an approximately rectangular cross-sectional shape of the second ground electrode is 2 or more,
    wherein the convex portion of the second ground electrode is formed within ⅓ of a width of the second ground electrode from the center of the second ground electrode in a width direction, and
    wherein a length of each convex portion measured along a width direction of the respective electrode is ⅓ or less of the width of the respective electrode.

2. The optical modulator according to claim 1, wherein the convex portion has a curved portion.

3. The optical modulator according to claim 2, wherein the convex portion is substantially circular in a plan view.

4. An optical transmission apparatus in which the optical modulator according to claim 1 is mounted.

5. A method of manufacturing the optical modulator according to claim 1, comprising:
    forming the convex portion on the upper surface of the electrode using ball bonding.

6. The optical modulator according to claim 1, wherein the ground electrodes that are positioned interposing each of the hot electrodes are connected to each other by the metal wires.

7. The optical modulator according to claim 1, wherein wire-bonding of the metal wires that are performed multiple times includes ball bonding and wedge bonding.

8. The optical modulator according to claim 7, wherein the ball bonding and the wedge bonding are performed in the order of the ball bonding then the wedge bonding.

* * * * *